US005412624A

United States Patent [19]

Yocom

[11] Patent Number: 5,412,624

[45] Date of Patent: May 2, 1995

[54] REAL-LIFE TIMER INTERVAL ADJUSTMENT

[75] Inventor: Thomas M. Yocom, Ft. Lauderdale, Fla.

[73] Assignee: ABB Power T & D Company, Inc., Blue Bell, Pa.

[21] Appl. No.: 135,853

[22] Filed: Oct. 13, 1993

Related U.S. Application Data

[63] Continuation of Ser. No. 807,989, Dec. 16, 1991, abandoned.

[51] Int. Cl.[6] ........................ G04B 5/00; G04B 17/12; H03L 7/00; G06F 15/20

[52] U.S. Cl. .................................... 368/156; 368/200; 331/25; 364/569

[58] Field of Search ............................... 368/155-157, 368/200-202, 46, 52; 331/1 R, 2, 17, 18, 25; 364/569; 375/110, 118-120

[56] References Cited

U.S. PATENT DOCUMENTS

| | | | |
|---|---|---|---|
| 4,097,801 | 6/1978 | Freeman et al. | 324/188 |
| 4,407,589 | 10/1983 | Davidson et al. | 368/201 |
| 4,448,543 | 5/1984 | Vail | 368/202 |
| 4,456,386 | 6/1984 | Dellea | 368/201 |
| 4,903,251 | 2/1990 | Chapman | 368/156 |
| 4,947,382 | 8/1990 | Lesea | 368/118 |
| 5,027,297 | 6/1991 | Garrity et al. | 364/569 |

OTHER PUBLICATIONS

"Existing Relay Network Interfce (ERNI)", Jun. 1991, ABB Power T&D Company Inc.

*Primary Examiner*—Vit W. Miska

*Attorney, Agent, or Firm*—Woodcock Washburn Kurtz Mackiewicz & Norris

[57] ABSTRACT

A system and method for controlling time-critical functions by dynamically adjusting the interrupt frequency of a microprocessor. Interrupts are generated at a predetermined frequency. Time-critical functions are then performed in response to the interrupts. The interval is adjusted based on timing data from a substantially accurate source. Where the interval is measured in terms of clock pulses, a non-integer number of pulses per interval is attained by varying the number of pulses per interval so that the average over a number of intervals is equal to the non-integer number of pulses per interval. The interval is further adjusted using a selected damping coefficient to eliminate an underdamped condition.

20 Claims, 2 Drawing Sheets

REAL-LIFE TIMER INTERVAL ADJUSTMENT

This is a continuation of application Ser. No. 07/807,989, filed Dec. 16, 1991, now abandoned.

FIELD OF THE INVENTION

The present invention relates to a system and a method for dynamically adjusting the interrupt frequency of a microprocessor timer thereby increasing the accuracy of time-critical functions. In particular, the present invention provides a system and a method for adjusting the timer interrupt frequency according to timing information from a substantially accurate source.

BACKGROUND OF THE INVENTION

Although it is often believed that quartz crystal oscillators are very accurate, temperature changes and crystal aging cause substantial shifts in a crystal's natural frequency. For many systems, this frequency shift is unacceptable and some means of correction is needed.

For frequency correction, trimmer capacitors are inserted to fine tune the crystal frequency. If these are temperature compensating capacitors, the oscillator's frequency can be made more consistent over wide temperature swings. Disadvantages, however, include the need to tune these capacitors for each crystal, and of course the added cost of the components. Additionally, the capacitors provide no automatic correction for frequency shifts from aging.

Some devices, like ABB ERNIs which are known in the art, incorporate a timer interrupt mechanism that executes an interrupt after a counter attains a specific threshold value. The frequency this counter is incremented is related to the crystal, so an inaccurate crystal will cause inaccurate timer interrupt intervals. Since these intervals may be used in time critical functions such as a time stamping scheme as disclosed in U.S. patent application Ser. No. 414,999 entitled "A System for Time Stamping Events Using a Remote Master Clock", filed Sep. 29, 1989, it is essential that they be as accurate as possible.

SUMMARY OF THE INVENTION

The present invention provides a system and method for controlling time critical functions. Interrupts are generated at a predetermined interval. The time-critical functions are then performed in response to the interrupts and the interval is adjusted using timing data from a substantially accurate source.

In a preferred embodiment, a shift in the interrupt frequency is determined with respect to the timing data and a new interval is defined to compensate for the frequency shift. Based on the new interval, the interrupt frequency is altered by increasing the time between a first number of interrupts and by decreasing the time between a second number of interrupts. The average of the time between interrupts of the first and second numbers of interrupts is indicative of the new interval. In a further preferred embodiment the interval is adjusted by a damping coefficient to prevent an underdamped system condition.

The interval is preferably a number of clock pulses provided by a timing means at a fixed frequency. A cycle can be defined as a number of interrupts. Thus, the new interval can be based on the average number of pulses per interval over a given cycle. By averaging over a cycle, non-integer intervals in terms of pulses per interval can be realized.

BRIEF DESCRIPTION OF THE DRAWINGS

The present invention will be better understood and its numerous objects and advantages will become apparent by reference to the following detailed description of the invention when taken in conjunction with the following drawings, in which.

DETAILED DESCRIPTION OF THE INVENTION

Figure 1:
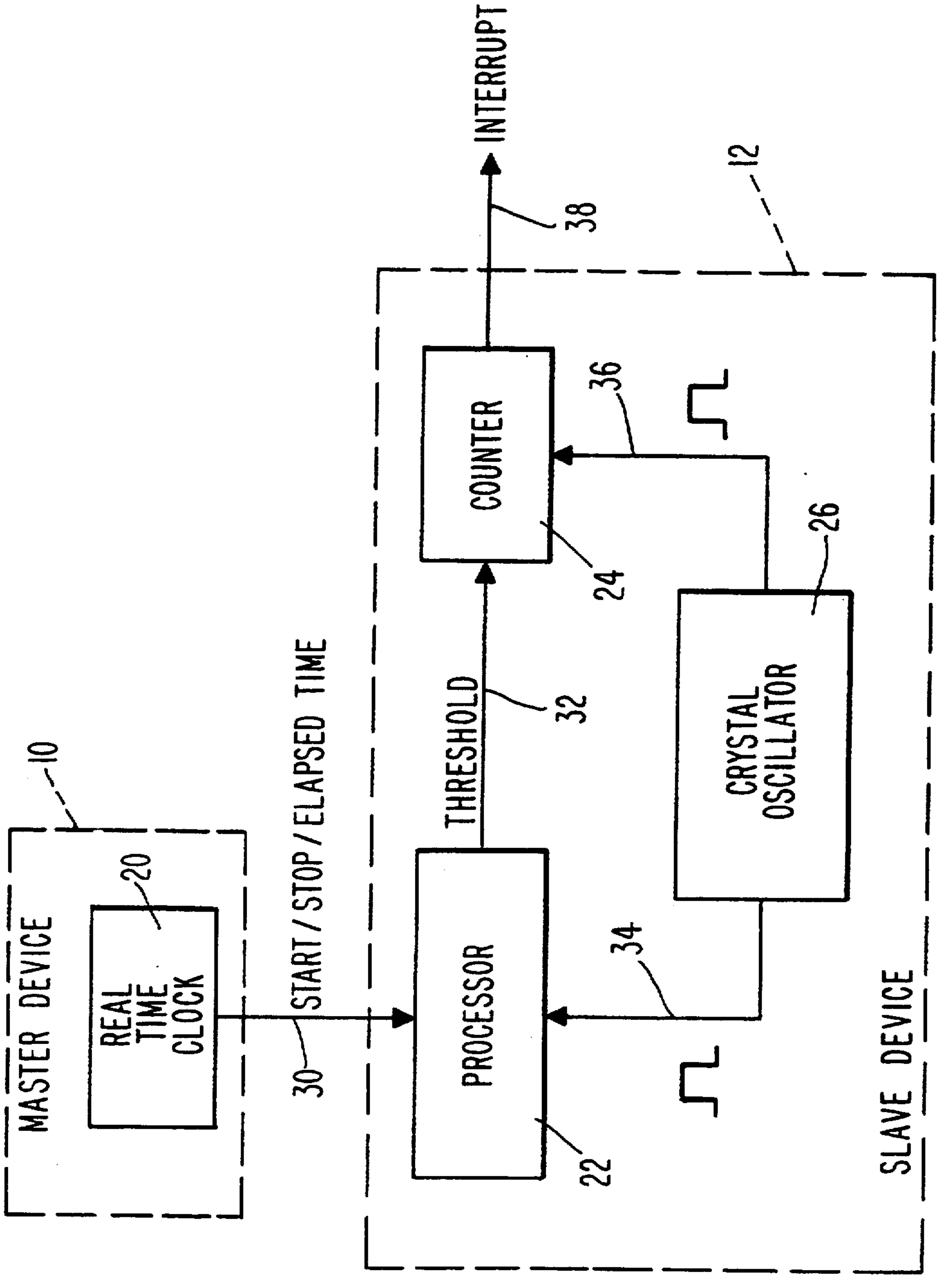
FIG. 1 is a system block diagram in accordance with the present invention.

Referring to FIG. 1, a network having a master device 10, slave device 12 and network communication bus 30 are depicted. The master device 10 has a real-time clock 20 which has a substantially accurate time base. The slave device 12 comprises a processor 22, an interrupt counter 24, and an oscillator 26, which is typically a quartz crystal oscillator.

When the slave device 12 is initially powered, the interrupt counter 24 is reset to zero, and the timer threshold value is set to a default value. This default value is based on the assumption that the device will be used at a specific temperature and the crystal's "make" frequency, that is, the actual frequency of a newly manufactured crystal. When counter 24 reaches this default threshold, an interrupt is initiated. At this point, any time-specific functions, such as time stamping information, are performed. An interrupt is provided each time the counter attains the default threshold.

The master device 10, supplies the slave device 12 with three pieces of data:

i) A start mark which causes the device to note the current time and store it in a "start" register, ii) A stop mark which causes the device to note the current time and store it in a "stop" register, iii) The elapsed time between the start and stop marks which is assumed to be accurate.

Essentially the processor 22 determines the elapsed time by subtracting the start time from the stop time. It then compares this internal elapsed time with the received elapsed time. Differences are used to change the default counter value to a count that will improve the accuracy of the interrupt interval.

If the internal elapsed time is less than the received elapsed time, counter threshold value is decreased; causing interrupts to occur more frequently. Likewise, if the internal elapsed time is greater than the received elapsed time the threshold value is increased.

The new threshold N can be determined from the equation:

$$N = \frac{I}{R} * C \tag{1}$$

where I is the internal elapsed time calculated by the processor 22, R is the received elapsed time provided by the clock 20, and C is the current threshold value.

This equation is derived from the following:

$$E = \frac{I - R}{R} \tag{2}$$

Where E is the internal time base or oscillator error. Then to create a new threshold, start with the current threshold, C, and use E as a correction factor, so that:

$$N = C + E^{*}C \tag{3}$$

Simplifying equation (3) gives:

$$N = C^{*}(1 + E) \tag{1}$$

$$N = C^{*}\left(1 + \frac{I - R}{R}\right)$$

$$N = C^{*}\frac{I}{R}.$$

This equation cannot be applied directly because typically the new interval will include a fractional quantity. Since the counter 24 increments in integers, interrupts cannot be initiated after, for instance, 200.85 pulses of the oscillator 26, therefore a further refinement is needed.

In a preferred embodiment the new interval is dynamically altered in a cyclic pattern. Using 200.85 as an example, let one cycle be 100 interrupts. Now for 85 of these 100 interrupts, the interrupt is executed after 201 pulses, and for the remaining 15 interrupts, after 200 pulses. Thus the average over 100 interrupts is precisely 200.85 pulses per interrupt (e.g., 85 * 201 + 15 * 200).

To determine how many interrupts per cycle need to be stretched, use:

$$D = N - INT(N) \tag{4}$$

where D is the distance between the new interval and the nearest integer less than the new interval.

```
|<——distance——>|          |
200            200.85     201
lower integer  ideal      higher integer threshold
  threshold
```

Then, the number of interrupts per cycle which need to be stretched to the higher integer threshold is D multiplied by the cycle size or, in this example where one cycle is 100 interrupts, 85 elements need to be stretched (i.e., 0.85*100).

If the cycle size is carefully selected, another option for calculating the new threshold and stretch count is available. Using the above example, with a cycle size of 100, the digits of the stretch count, 85, are always identical to the fractional part of the new ideal threshold, 0.85. Thus, all fractional quantities may be eliminated by modifying equation 1 as follows:

$$N' + \frac{I}{R}C \tag{5}$$

where C'=100*C+stretch count then N=INT(N'/100) and stretch=lower two digits of INT(N'). For example, let the internal elapsed time be 76 seconds, the current threshold is 200, the current stretch is 85, and the received time is 77 seconds.

$$C' = 100 * 200 + 85 = 20{,}085$$

-continued $$N' = \frac{76 * 20{,}085}{77} = 19824.16$$

Then N equals INT(19824.16/100) which is 198, and stretch equals the lower 2 digits of INT(19824.16) which is 24.

In order to avoid unnecessary division and multiplication, multiplying and dividing by 100 are the same as shifting the decimal point two places right and two places left, respectively. This technique saves microprocessor time by speeding up the routine.

When working with hexadecimal numbers, the principle is identical, but the cycle size is preferably selected to be 256 or 100 h. Then instead of multiplying by 100 (base 10), multiply by 100 h, or shift the "heximal" point two places right.

This system is essentially an underdamped feedback control mechanism, thus using it "as is" can result in the interval toggling back and forth between values that are too high, and too low. To prevent this situation, a damping coefficient is preferably incorporated in determining the new interval:

$$new_{13}\ damped = P^{*}\overline{DAMP} + N^{*}DAMP \tag{6}$$

where P is the previous interval, DAMP is the selected damping coefficient and $\overline{DAMP}$is 1−DAMP, N is the new threshold calculated from equation 1.

As an example, let the previous interval be 200.00, and the new interval be 201.00. Using the ERNI damping coefficient of 0.707, which is a typical value used to obtain "critical damping" in many control systems:

$$new\_damp = 200.00(1 - 0.707) + 201.00^{*}0.707$$

so $$new\_damp = 200.707,$$

and this interval is used rather than 201.00.

Selection of the damping coefficient involves the usual tradeoffs for feedback control systems. Choosing a very large damping coefficient (close to 1.00) will result in a very slowly changing system, but one that will never overshoot the ideal interval. On the other hand, a small damping coefficient will allow the system to reach the ideal quickly, but pass it right on by. The threshold will continue to oscillate until the system eventually settles.

Figure 2:
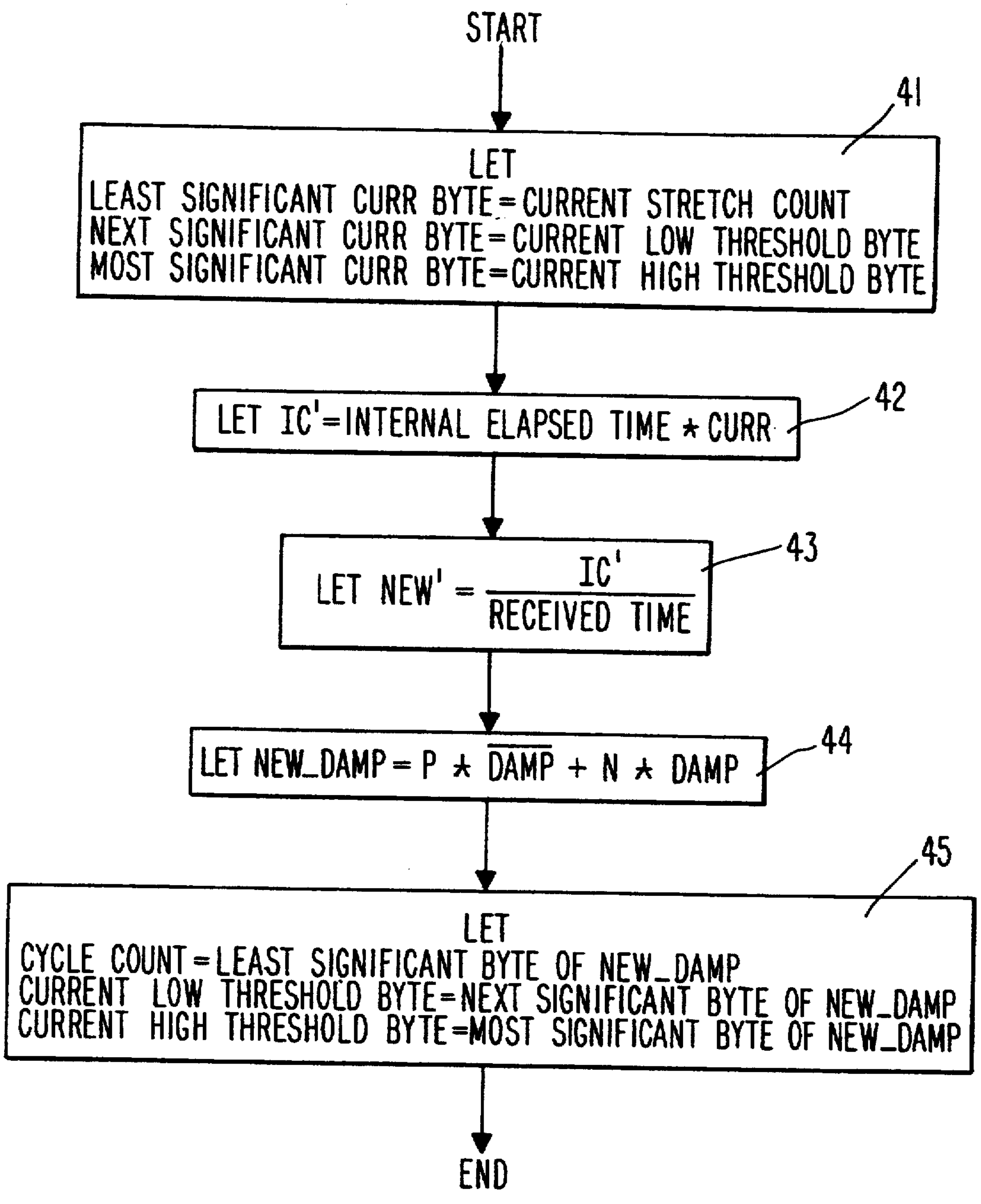
FIG. 2 is a flow diagram representing one implementation of the present invention.

The flowchart in FIG. 2 shows one implementation of the present invention by processor 22. This particular diagram depicts the ERNI code as an example.

The current threshold and stretch count are moved into adjacent bytes, to be treated as one three byte quantity at 41.

The numerator for equation 5 is calculated at 42. Since, the ERNI processor instruction set does not include multiplication or division, several subroutines perform multiplication of multiple byte numbers. The new interval N' is calculated at 43, where an interval halving scheme is used for division of multiple byte numbers. The new damped interval is calculated at 44.

The new threshold bytes are mapped into the corresponding registers for the current threshold at 45. Finally these bytes are output to counter 24 for executing interrupts according to the current interval.

This technique has several advantages:

it is inexpensive: it does not require additional components, requires no manual adjustments of capacitors, and can be implemented entirely in software, it is adaptable: it compensates for the current frequency of the crystal; if that crystal's frequency drifts with age, temperature, or was just inaccurately made, the scheme will just alter the interval to correct, it effectively improves the resolution of the microprocessor's clock allowing much finer adjustments of the interrupt interval, It is flexible: the time between start and stop marks doesn't have to be consistent, thus the master doesn't have to promptly service the slave's interval adjustment needs. Further, the damping coefficient can be altered, even "on the fly" in order to achieve better results.

It should be appreciated that the present invention is not limited to its use in ABB ERNIs nor is it limited to controlling time stamping functions. The implementation described herein is purely an example. Thus, those skilled in the art will recognize that modification and variations may be made without departing from the principles of the invention described herein above and set forth in the following claims.

I claim:

1. A method of controlling time critical functions comprising the steps of:

generating interrupts at a predetermined interval, the reciprocal of the interval defining an interrupt frequency;

performing the time-critical functions in response to the interrupts;

determining a shift in the interrupt frequency using timing data from a substantially accurate source;

defining a new interval to compensate for the frequency shift; and altering the interrupt frequency by increasing the time between a first number of interrupts and by decreasing the time between a second number of interrupts, the average of the time between interrupts of the first and second numbers of interrupts being indicative of the new interval.

2. The method of claim 1, further comprising the step of:

adjusting the new interval using a selected damping coefficient.

3. The method of claim 1, wherein the interval is a number of clock pulses provided by a timing means at a fixed frequency.

4. The method of claim 3, further comprising the steps of:

selecting the first number of interrupts and the second number of interrupts so that the sum of said numbers is substantially the number of interrupts in the cycle; and incrementing the number of clock pulses per interval for the first number of interrupts and decrementing the number of clock pulses per interval for the second number of interrupts so that the average time between interrupts of the first and second numbers of interrupts is indicative of the new interval.

5. The method of claim 3, wherein the step of determining the shift in the interrupt frequency comprises the steps of:

determining a measure indicative of time maintained by the timing means; and comparing the measure with the timing data from the substantially accurate source, the result being related to the shift in the interrupt frequency.

6. The method of claim 4, wherein the new interval is a non-integer number of pulses per interval.

7. A system for controlling time-critical functions, comprising:

timing means for providing a fixed frequency signal;

counting means for counting a predetermined interval using the fixed frequency signal;

interrupt means for generating interrupts each interval, the time-critical functions being responsive to the interrupts; and adjustment means for adjusting the interval using timing data from a substantially accurate source by increasing the time between a first number of interrupts and by decreasing the time between a second number of interrupts, the average of the time between interrupts of the first and second numbers of interrupts being indicative of a new interval.

8. The system of claim 7, wherein the adjustment means further comprises:

error detection means for determining a shift in the fixed frequency relative to the timing data; and threshold means for calculating the new interval to compensate for the frequency shift.

9. The system of claim 7, wherein the fixed frequency signal provides pulses at a fixed frequency and the counting means counts a specified number of pulses, the number of pulses defining the interval.

10. The system of claim 7, wherein the adjustment means adjusts the interval using a selected damping coefficient.

11. A method of controlling time critical functions comprising the steps of:

generating interrupts at a predetermined interval, the reciprocal of the interval defining an interrupt frequency;

performing the time-critical functions in response to the interrupts;

adjusting the interval using timing data from a substantially accurate source; and further adjusting the interval using a selected damping coefficient.

12. The method of claim 11, further comprising the steps of:

determining a shift in the interrupt frequency with respect to the timing data;

defining a new interval to compensate for the frequency shift; and altering the interrupt frequency by increasing the time between a first number of interrupts and by decreasing the time between a second number of interrupts, the average of the time between interrupts of the first and second numbers of interrupts being indicative of the new interval.

13. The method of claim 11, wherein the interval is a number of clock pulses provided by a timing means at a fixed frequency.

14. The method of claim 13, further comprising the steps of:

selecting a number of interrupts, the number defining a cycle;

calculating an error indicative of a frequency shift in the fixed frequency with respect to the timing data; and establishing a new interval having a different number of pulses per interval to compensate for the error on a per cycle basis.

15. The method of claim 14, wherein the step of calculating the error comprises the steps of:

determining a measure indicative of time maintained by the timing means; and comparing the measure with the timing data from the substantially accurate source, the result being the error.

16. The method of claim 14, wherein the new interval is a non-integer number of pulses per interval.

17. A system for controlling time-critical functions, comprising:

timing means for providing a fixed frequency signal;

counting means coupled to the timing means for counting a predetermined interval using the fixed frequency signal and for generating interrupts each interval, the time-critical functions being responsive to the interrupts; and adjustment means coupled to the timing means and the counting means for adjusting the interval using 1) timing data from a substantially accurate source and 2) a selected damping coefficient.

18. The system of claim 17, wherein the adjustment means further comprises:

error detection means for determining a shift in the fixed frequency relative to the timing data; and threshold means for calculating a new interval to compensate for the frequency shift.

19. The system of claim 17, wherein the fixed frequency signal provides pulses at a fixed frequency and the counting means counts a specified number of pulses, the number defining the interval.

20. The system of claim 18, wherein the adjustment means adjusts the interrupt frequency by increasing the time between a first number of interrupts and by decreasing the time between a second number of interrupts, the average of the time between interrupts of the first and second numbers of interrupts being indicative of the new interval.

* * * * *

UNITED STATES PATENT AND TRADEMARK OFFICE

CERTIFICATE OF CORRECTION

PATENT NO. : 5,412,624

DATED : May 2, 1995

INVENTOR(S) : Thomas M. Yocom

It is certified that error appears in the above-indentified patent and that said Letters Patent is hereby corrected as shown below:

At column 3, lines 56-60, the equation should be:

$$N' + \frac{IC'}{R}$$

At column 3, line 67, "C" in equation should be "C'"

At column 4, line 25, the equation should read:

$$\text{new\_damped} = P * \overline{DAMP} + N * DAMP$$

At column 4, line 28, after DAMP, insert space before and after the word "is"

Signed and Sealed this

Twenty-ninth Day of August, 1995

Attest:

Bruce Lehman

BRUCE LEHMAN

*Attesting Officer*

*Commissioner of Patents and Trademarks*